May 19, 1964

A. M. WALKOW 3,134,058

ENCASEMENT OF TRANSISTORS

Filed Nov. 18, 1959

3 Sheets-Sheet 1

INVENTOR

Arnold Maury Walkow

BY Stevens, Davis, Miller & Mosher

ATTORNEYS

May 19, 1964 | A. M. WALKOW | 3,134,058
ENCASEMENT OF TRANSISTORS
Filed Nov. 18, 1959 | 3 Sheets-Sheet 2
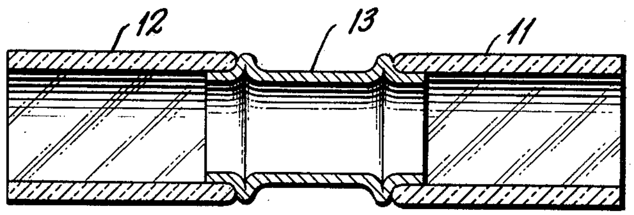
Fig. 4.
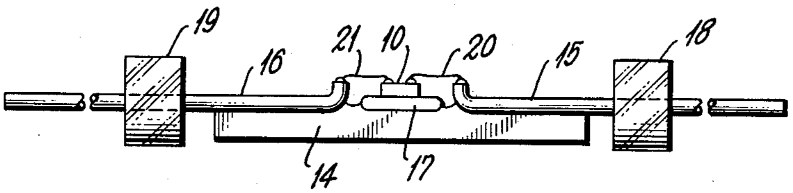
Fig. 5.
Fig. 6.
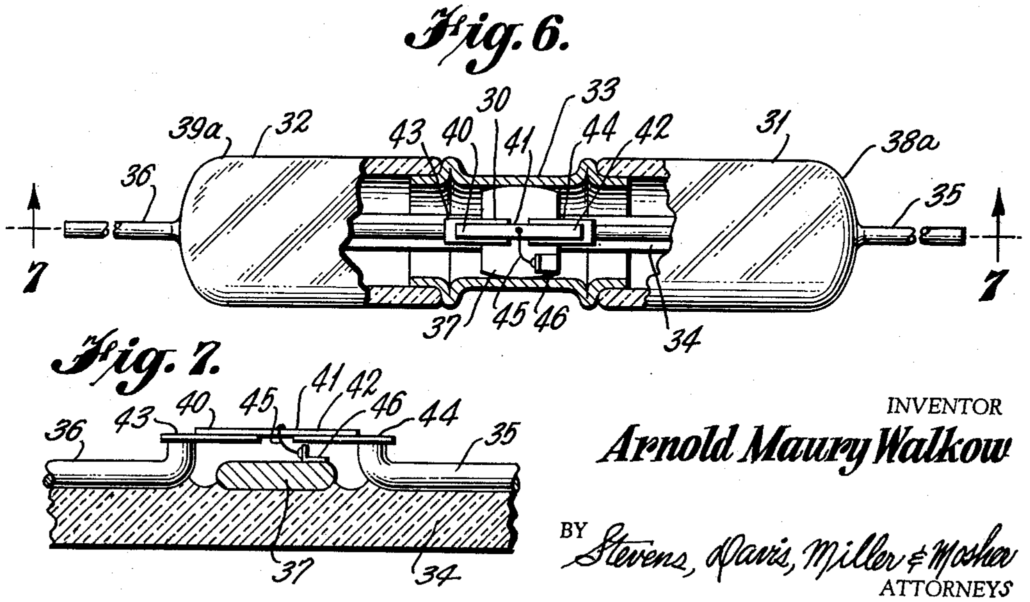
Fig. 6, Fig. 7.
INVENTOR
Arnold Maury Walkow
BY Stevens, Davis, Miller & Mosher
ATTORNEYS May 19, 1964 A. M. WALKOW 3,134,058

ENCASEMENT OF TRANSISTORS

Filed Nov. 18, 1959 3 Sheets-Sheet 3

INVENTOR
Arnold Maury Walkow

BY Stevens, Davis, Miller & Mosher
ATTORNEYS

United States Patent Office 3,134,058

Patented May 19, 1964

3,134,058

ENCASEMENT OF TRANSISTORS

Arnold M. Walkow, Dallas, Tex., assignor to Texas Instruments Incorporated, Dallas, Tex., a corporation of Delaware Filed Nov. 18, 1959, Ser. No. 853,889
11 Claims. (Cl. 317—234)

This invention relates to the encasement of semiconductor devices, and more particularly to a glass encasement for a transistor which is produced by employing two subassemblies so constructed that a conductive sleeve having a substantial lateral surface acts as one electrode while insulated coaxial leads are connected to the other electrodes of the transistor.

It has long been recognized that glass enclosures for semiconductor devices are, in some ways, preferable to metallic enclosures. For example, methods of sealing metal enclosures, such as welding or soldering, release contaminants within the enclosure which are harmful to the devices enclosed. Previously, semiconductor devices were being encased in housings made of soft glass. Such encasements are undesirable not only because soft glass is readily breakable, but because the soft glass housing must be annealed after the semiconductor device is sealed inside of the housing. The annealing must be carried out at high temperatures which are harmful to the encased semiconductor device.

It is therefore an object of the present invention to provide an improved glass housing for semiconductor devices which is less breakable than previous semiconductor glass encasements and which affords better protection to the semiconductor device, since no weld gasses or other contaminants are given off during the sealing the housing which would damage the semiconductor surfaces.

It is a further object of the present invention to provide a glass package for encasing semiconductor devices which is less expensive and better adapted to mass production than present semiconductor encasements.

It is a still further object of the present invention to provide a novel and unique semiconductor encasement construction which lends itself to ready and automatic mounting in transmission lines.

It is a still further object of the present invention to provide mounting and encapsulating means for semiconductor devices in which the semiconductor device may be given final tests immediately prior to sealing the device inside the housing rather than after the sealing operation.

It is a still further object of the present invention to provide improved mounting and encapsulating means for semiconductor devices and especially for diffused base and grown junction types of transistors.

It is a still further object of the present invention to provide a method for encapsulating and sealing a transistor inside a glass package in which the transistor may be sealed in a vacuum or in any desired inert gas atmosphere.

It is a still further object of the present invention to provide a technique for the glass encapsulation of semiconductor devices which can be carried out more readily and efficiently and at lower cost than previous methods.

In accordance with the objectives stated above, the method of the present invention includes forming a sum-assembly comprising a glass bar having a conductive plate and a pair of conductive wires fused thereto, the transistor to be encased being mounted on the conductive plate with one region of the transistor being electrically connected to the plate and each other region connected to one of the conductive wires; forming a second subassembly comprising a conductive sleeve having a glass tube fused to each of its ends, inserting the first subassembly into the second sub-assembly, electrically connecting the plate to the sleeve, and sealing the outer ends of the glass tubes about the conductive wires.

Other and further objects, advantages and characteristic features of the invention will become readily apparent upon consideration of the following detailed description of preferred embodiments of the invention when taken in conjunction with the appended drawings in which:

FIGURE 4 shows the outer sub-assembly of the encasing means used in forming the embodiment of FIGURES 1, 2 and 3;

FIGURE 5 illustrates the inner sub-assembly used in constructing the embodiment of FIGURES 1, 2 and 3;

FIGURE 6 is a plan view with parts in section of a glass encased transistor assembly provided by another embodiment of the invention which is especially adapted to house a grown junction transistor;

FIGURE 7 is an enlarged side elevation of the transistor elements and connection tabs shown in FIGURE 6;

Figure 1:
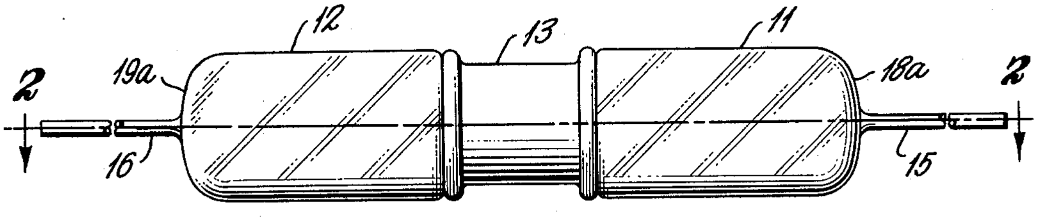
FIGURE 1 is a side view of a glass encased transistor assembly provided by the present invention.
Figure 2:
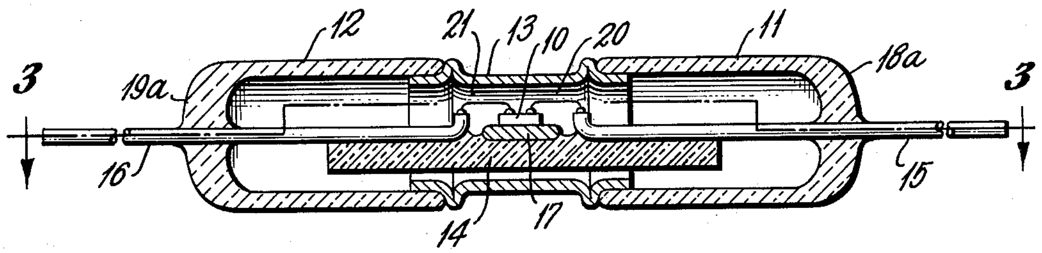
FIGURE 2 is a vertical axial section taken along line 2—2 of FIGURE 1.
Figure 3:
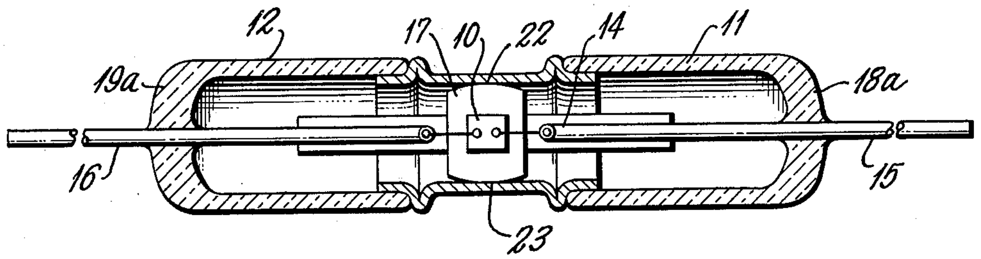
FIGURE 3 is a horizontal axial section taken along line 3—3 of FIGURE 2.

Referring now to the drawings, and more particularly to FIGURES 1–3, there is shown an encapsulated semiconductor device 10. The semiconductor device 10 is preferably a transistor of the diffused base type, but it should be understood that the encapsulation principles of the present invention are applicable to other types of semiconductor devices.

The encasement for the transistor 10 includes two subassemblies which are illustrated separately in FIGURES 4 and 5. The outer sub-assembly is shown in FIGURE 4 and includes a pair of glass tubes 11 and 12 fused to opposite ends of a conductive sleeve 13, which is preferably of Kovar. The inner sub-assembly is illustrated in FIGURE 5 and includes a glass bar 14 having a pair of conductive leads 15 and 16, preferably of Kovar, fused thereto. A conductive plate 17, which is preferably of Kovar, but which may also be of molybdenum or other suitable material, is fused to the top of the glass rod 14 at its center. A pair of glass beads 18 and 19 are mounted on the leads 15 and 16, respectively, and are used to seal the outer ends of the glass tubes 11 and 12 about the Kovar leads 15 and 16 during the final assemblying of the transistor encasement. The glass tubes 11 and 12 and the beads 18 and 19 are preferably of hard glass, such as Corning Type 7052, while the conductive sleeve 13, as well as the leads 15 and 16, should be of a material having essentially the same thermal coefficient of expansion as glass.

The transistor wafer 10 is mounted on the conductive plate 17, with ohmic connection being afforded from one region of the transistor 10 to the plate 17. Connection to the other regions of the transistor 10 is made by means of wires 20 and 21 which are connected to the inner ends of the leads 15 and 16, respectively.

In forming the completed assembly shown in FIGURES 1–3, the sub-assemblies shown in FIGURES 4 and 5 are first constructed and the inner sub-assembly is inserted into the outer sub-assembly. The glass beads 18 and 19 are mounted on the leads 15 and 16 adjacent the outer ends of the glass tubes 11 and 12 respectively. The conductive plates 17 is spotwelded to the sleeve 13 at points 22 and 23 (see FIGURE 3) to provide conductive paths from one region of the transistor 10 to the sleeve 13. The ends of the glass tubes 11 and 12 and the glass beads 18 and 19 are then heated to melt the glass and to fuse the beads 18 and 19 to the glass tubes 11 and 12, thus forming seals at 18*a* and 19*a* respectively. As a result, a completely encapsulated transistor assembly is produced. The leads 15 and 16 afford connection to two of the regions of the transistor while connection to the third region is made by attaching a slip-ring or clip-type lead to the sleeve 13. The sleeve 13, attached to the transistor carrying plate, thus not only affords contact with external leads but also serves as a heat sink for the transistor.

Alternately, the glass beads 18 and 19 may be dispensed with, the units then being sealed by metallizing the ends of the tubes 11 and 12 and sealing metal caps thereto. This could be accomplished, for example, by placing metal caps over the ends of the tubes 11 and 12 and fusing the caps to the leads 15 and 16 and the metallized ends of the tubes. Or, a small disk could be wedged into the glass tube and around the lead to form a cup at the end of the tube which could be filled with molten solder. On solidifying, the solder would adhere to the lead and the metallized inner surface of the tube to form the seal.

FIGURES 6 and 7 show an embodiment of the present invention which is specially adapted to house a grown junction transistor. The grown junction transistor is indicated generally by the numeral 30 and has an emitter or collector 40, a very narrow base region 41 and a collector or emitter 42. In order to simplify the discussion, the region 40 will be hereinafter referred to as the emitter and the region 42 will be termed the collector. It should be understood, however, that the region 42 could equally well serve as the emitter, with the region 40 then being the collector. As is shown in more detail in FIGURE 7, the emitter 40 and the collector 42 are mounted on tabs 43 and 44 respectively, the tabs not only serving to hold the transistor but also providing ohmic connections to the emitter and collector regions. The tabs 43 and 44 are connected to leads 36 and 35, respectively, which are similar to the leads 16 and 15 of the embodiment of FIGURES 1–3. The leads 35 and 36 are fused on top of a glass bar 34, and the assembly is mounted inside a conductive sleeve 33 having its ends fused to glass tubes 31 and 32. Glass bead seals at 38*a* and 39*a* form a completely sealed enclosure and fuse the glass tubes 31 and 32 to the leads 35 and 36, respectively. A conductive plate 37 is mounted on the glass bar 34, and a base tab 46 is soldered or spotwelded to the plate 37. A lead wire 45 connects the base 41 of the transistor 30 to the base tab 46. As is similar to the embodiment of FIGURES 1–3, the plate 37 is spotwelded to the sleeve 33 so that connection to the base of the encased transistor may be made by connecting an external lead to the sleeve 33, in the same manner as in the first embodiment. Essentially the only difference between the embodiment of FIGURES 1–3 and the embodiment shown in FIGURES 6 and 7 is that in the grown junction embodiment shown in FIGURES 6 and 7 the transistor is supported on emitter and collector tabs 43 and 44 rather than on the base plate, and that the additional tab 46 and the lead wire 45 must be employed in order to afford connection to the thin base region 41, whereas in the embodiment of FIGURES 1–3 the base region is large enough for direct attachment to either the plate 17 or to wires 20 or 21.

Figures 8, 9:
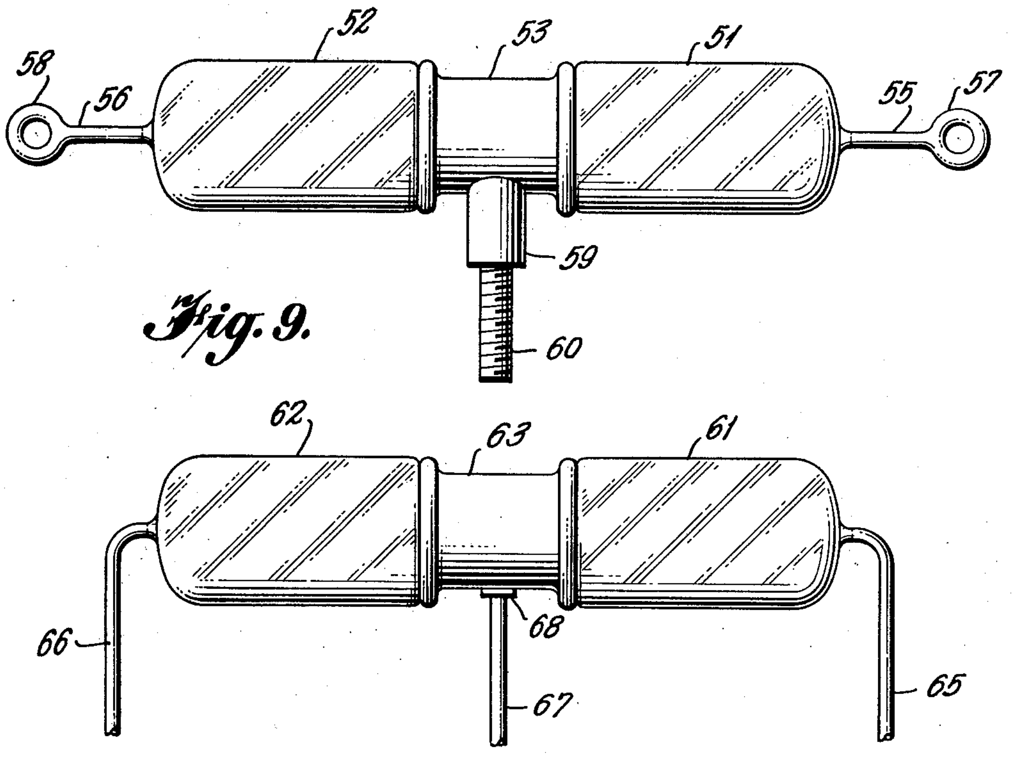
FIGURE 8 is a side elevation of an encapsulated medium power transistor provided by a further embodiment of the present invention.
FIGURE 9 shows an encapsulated transistor assembly provided by still another embodiment of the present invention.

FIGURE 8 shows a further embodiment of the present invention which is specifically adapted to encapsulate a medium power transistor. The casing includes glass tubes 51 and 52 connected to the ends of a conductive sleeve 53, with leads 55 and 56 to two regions of the transistor projecting from the sealed ends of the tubes 51 and 52. The leads 55 and 56 are provided with eyelet terminals 57 and 58 at their outer ends to allow for ready electrical connection. The conductive sleeve 53, which is connected to the third region of the encased medium power transistor in the same manner as that employed in the embodiments described above, is provided with a stud 59 projecting from the lateral surface of the sleeve 53. A threaded extension 60 of the stud 59 is used to strap down the transistor to a suitable heat sink which is also a convenient electrical contact. This prevents excessive heating of the transistor wafer and, at the same time, affords electrical contact with the third region of the transistor.

FIGURE 9 illustrates a further embodiment of the invention wherein the glass encapsulated transistor assembly is constructed so as to form a plug-in package. The assembly includes glass tubes 61 and 62 fused to opposite ends of a conductive sleeve 63, with leads to two transistor regions projecting from the respective sealed ends of the glass tubes 61 and 62 and being bent so as to lie perpendicular to the longitudinal axis of the glass tubes and the conducting sleeve. A lead 67 to the third region is soldered or spotwelded to the conductive sleve 63 at 68 and extends out from the sleeve 63 parallel to the leads 65 and 66. In this embodiment, the leads 65, 66 and 67 may be plugged into suitable sockets, rather than being attached or clipped to additional lead wires.

Figure 10:
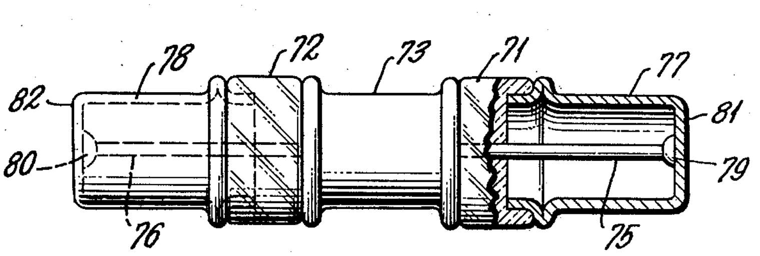
FIGURE 10 is a side elevation partly in section of a glass encased transistor package provided by a still further embodiment of the present invention.

FIGURE 10 shows a still further embodiment of the present invention in which the glass encased transistor assembly is constructed in the form of a fuse clip package, since slip-ring or clip-type leads may be employed to make the emitter, collector and base connections. In this embodiment, the transistor is encased inside a conductive sleeve 73 having glass tubes 71 and 72 fused to its ends in the same manner as the embodiment of FIGURES 1–3. However, instead of having the wire leads 75 and 76 project from the outer ends of the glass tubes 71 and 72, conductive sleeves 77 and 78 are fused to the outer ends of the glass tubes 71 and 72, respectively, in the same manner as the sleeve 73 is fused to the inner ends of the glass tubes. The sleeves 77 and 78 are provided with end caps 81 and 82 to which the leads 75 and 76 are spotwelded or soldered at 79 and 80 respectively. It should also be pointed out that its is not necessary for both ends of the package to be constructed in fuse-clip fashion, but rather one of the glass tubes (71 or 72) could be sealed about the lead (75 or 76) projecting from its outer end in the manner shown in FIGURE 1.

Although the present invention has been shown and described with reference to particular embodiments, nevertheless changes and modifications obvious to one skilled in the art are deemed to be within the spirit, scope, and contemplation of the invention.

What is claimed is:

1. An encased transistor assembly comprising a conductive sleeve having a substantial lateral surface, a first glass tube fused to one end of said sleeve, a second glass tube fused to the other end of said sleeve, a transistor mounted on a conductive plate located inside said conductive sleeve, said conductive plate being mounted on a glass bar and being electrically connected to said conductive sleeve and to one region of said transistor, a first conductive wire fused to said glass bar and electrically connected to another region of said transistor, a second conductive wire electrically connected to a third region of said transistor, said first glass tube being sealed at its outer end about said first conductive wire, and said second glass tube being sealed at its outer end about said second conductive wire.

2. An encased transistor assembly according to claim 1 wherein said transistor is of the diffused base type.

3. An encased transistor assembly comprising a conductive sleeve having a substantial lateral surface, a first glass tube fused to one end of said sleeve, a second glass tube fused to the other end of said sleeve, a transistor mounted inside said conductive sleeve, a conductive plate mounted on a glass bar inside said sleeve and electrically connected to said sleeve and to one region of said transistor, said glass bar having a first conductive wire and a second conductive wire fused thereto, a first tab connected to said first wire and to another region of said transistor, a second tab connected to said second wire and to a third region of said transistor, said transistor being mounted on said tabs, said first glass tube being sealed at its outer end about said first conductive wire, and said second glass tube being sealed at its outer end about said second conductive wire.

4. An encased transistor assembly according to claim 3 wherein said transistor is of the grown junction type.

5. An encased transistor assembly comprising a first conductive sleeve having a substantial lateral surface, a first glass tube fused to one end of said sleeve, a second glass tube fused to the other end of said sleeve, a transistor mounted inside said conductive sleeve, one region of said transistor electrically connected to said conductive sleeve, a first lead wire electrically connected to another region of said transistor, a second lead wire electrically connected to a third region of said transistor, a second conductive sleeve fused to said first glass tube at the end which is not fused to said first conductive sleeve, said second conductive sleeve being connected to said first lead wire, and a third conductive sleeve fused to said second glass tube at the end which is not fused to said first conductive sleeve, said third conductive sleeve being connected to said second lead wire.

6. An encased transistor assembly according to claim 5 in which said first conductive sleeve is electrically connected to the base of said transistor.

7. An encased transistor assembly according to claim 5 in which said first conductive sleeve is electrically connected to the emitter of said transistor.

8. An encased transistor assembly according to claim 5 in which said first conductive sleeve is electrically connected to the collector of said transistor.

9. An encased transistor assembly comprising a conductive sleeve having a substantial lateral surface, a first glass tube fused to one end of said sleeve, a second glass tube fused to the other end of said sleeve, a transistor mounted inside said conductive sleeve, said conductive sleeve being electrically connected to one region of said transistor, a first conductive wire electrically connected to another region of said transistor, a second conductive wire electrically connected to a third region of said transistor, said first glass tube being sealed at its outer end about said first conductive wire, and said second glass tube being sealed at its outer end about said second conductive wire, said first and said second conductive wires each being provided with eyelet terminals outside of the sealed ends of said glass tubes, and a conductive tube having a threaded member connected thereto being connected to said sleeve.

10. An encased transistor assembly comprising a conductive sleeve having a substantial lateral surface, a first glass tube fused to one end of said sleeve, a second glass tube fused to the other end of said sleeve, a transistor mounted inside said conductive sleeve, said conductive sleeve being electrically connected to one region of said transistor, a first conductive wire electrically connected to a second region of said transistor, a second conductive wire electrically connected to a third region of said transistor, said first glass tube being sealed at its outer end about said first conductive wire, and said second glass tube being sealed at its outer end about said second conductive wire, said first and said second conductive wires each being bent at points outside of the sealed ends of said glass tubes so that a portion of each of said wires outside of said glass tube lies perpendicular to the longitudinal axis of said glass tubes and said conductive sleeve, and a conductive lead lying parallel to the said perpendicular portions of said conductive wires connected to said conductive sleeve.

11. An encased transistor assembly comprising a conductive sleeve having a substantial lateral surface, a first glass tube fused to one end of said sleeve, a second glass tube fused to the other end of said sleeve, a transistor mounted inside said sleeve, a conductive plate being electrically connected to one electrode of said transistor and making electrical contact with an inner portion of said sleeve, a first conductive wire electrically connected to a second electrode of said transistor, a second conductive wire electrically connected to a third electrode of said transistor, and a glass means inside said sleeve supporting said transistor, said plate, said first and said second conductive wires, said first glass tube and said second glass tube being sealed at their outer ends about said first conductive wire and said second conductive wire, respectively.

References Cited in the file of this patent

UNITED STATES PATENTS

| | | |
|---|---|---|
| 2,468,051 | Escoffery | Apr. 26, 1949 |
| 2,503,837 | Ohl | Apr. 11, 1950 |
| 2,560,579 | Kock et al. | July 17, 1951 |
| 2,563,613 | Ohl | Aug. 7, 1951 |
| 2,813,326 | Liebowitz | Nov. 19, 1957 |
| 2,827,598 | Levy et al. | Mar. 18, 1958 |
| 2,836,878 | Shepard | June 3, 1958 |
| 2,854,610 | Waters et al. | Sept. 30, 1958 |
| 2,862,160 | Ross | Nov. 25, 1958 |
| 2,866,140 | Jones et al. | Dec. 23, 1958 |
| 2,875,385 | Fuller | Feb. 24, 1959 |